United States Patent
Inutsuka et al.

(10) Patent No.: US 6,219,897 B1
(45) Date of Patent: Apr. 24, 2001

(54) ELECTRONIC COMPONENT MOUNTING APPARATUS FOR EXCHANGING SUPPORT BLOCKS WHICH SUPPORT CIRCUIT BOARDS

(75) Inventors: Ryoji Inutsuka, Osaka; Kunio Ohe, Hirakata; Tomoyuki Nakano, Kofu; Yoshiyuki Nagai, Toyonaka; Hideo Sakon, Takatsuki, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/335,737

(22) Filed: Jun. 18, 1999

Related U.S. Application Data

(62) Division of application No. 08/761,077, filed on Dec. 17, 1996.

(30) Foreign Application Priority Data

Dec. 18, 1995 (JP) .................................................. 7-329322

(51) Int. Cl.⁷ ........................................................ B25B 27/14
(52) U.S. Cl. ......................... 29/281.1; 269/903; 269/310
(58) Field of Search .................................. 269/900, 903, 269/909, 309, 310; 29/281.1

(56) References Cited

U.S. PATENT DOCUMENTS

| | | | |
|---|---|---|---|
| 4,131,270 | * | 12/1978 | Williams et al. ...................... 269/909 |
| 4,331,325 | * | 5/1982 | Urban et al. ............................ 269/43 |
| 5,005,814 | * | 4/1991 | Gumbert ................................ 269/903 |
| 5,190,273 | * | 3/1993 | Salvagnini ............................ 269/309 |
| 5,206,627 | * | 4/1993 | Kato ...................................... 269/903 |
| 5,218,753 | | 6/1993 | Suzuki et al. . |
| 5,465,470 | * | 11/1995 | Vongfuangfoo et al. ............. 269/903 |
| 5,669,599 | * | 9/1997 | Toh et al. .............................. 269/903 |
| 5,788,225 | * | 8/1998 | Iwata et al. ........................... 269/309 |
| 5,937,513 | * | 8/1999 | Inutsuka et al. ..................... 29/281.1 |
| 5,941,700 | * | 8/1999 | Fuchs .................................... 269/900 |

FOREIGN PATENT DOCUMENTS 0 501 551    9/1992    (EP) .

* cited by examiner

Primary Examiner—David A. Scherbel
Assistant Examiner—Lee Wilson
(74) Attorney, Agent, or Firm—Wenderoth, Lind & Ponack, L.L.P.

(57) ABSTRACT

An electronic component mounting apparatus is provided with a plurality of support blocks for supporting boards. A support block is automatically selected from among the plurality of support blocks and exchanged in accordance with the switching of the kind of boards to be supported by the support block, so that the time required for switching the kind of boards is reduced, thereby improving the productivity.

7 Claims, 4 Drawing Sheets

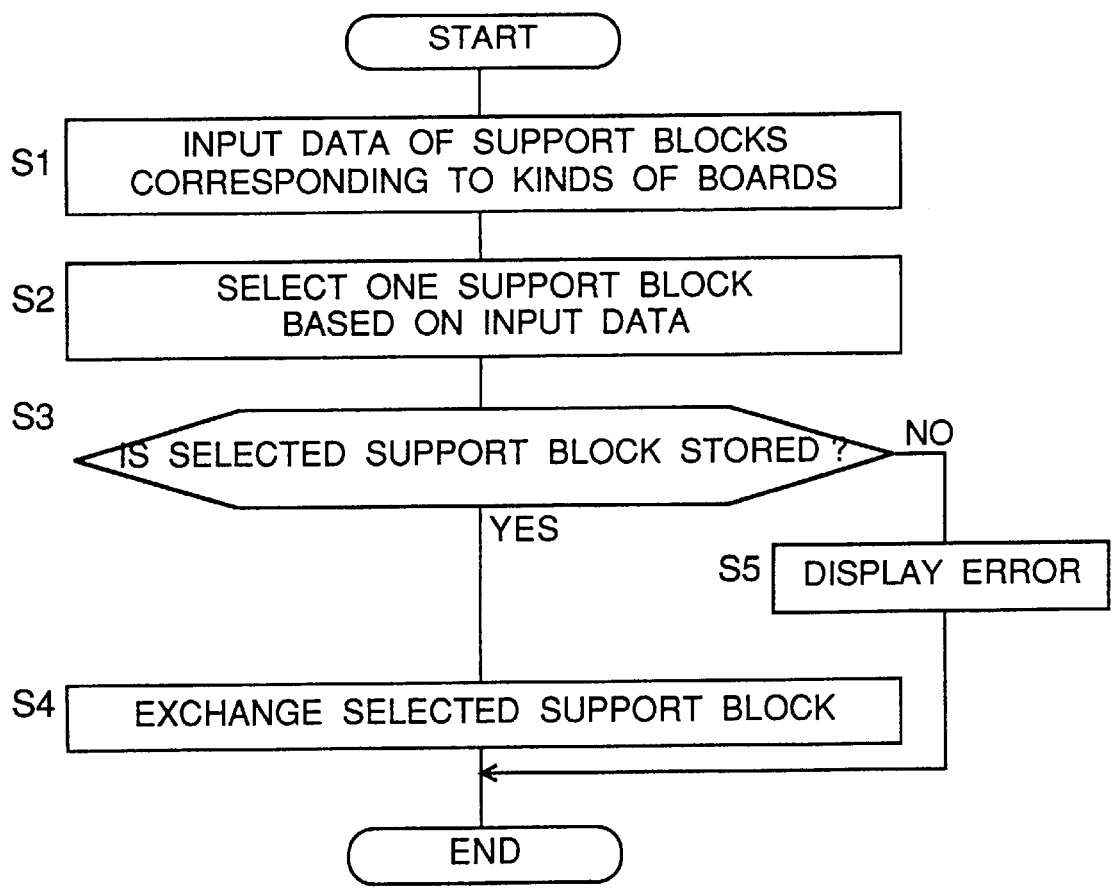

ELECTRONIC COMPONENT MOUNTING APPARATUS FOR EXCHANGING SUPPORT BLOCKS WHICH SUPPORT CIRCUIT BOARDS

This is a divisional application of Ser. No. 08/761,077, filed Dec. 17, 1996.

BACKGROUND OF THE INVENTION

The present invention relates to an electronic component mounting apparatus and method for mounting electronic components on boards to thereby produce electronic circuit boards, and more particularly, to an electronic component mounting apparatus equipped with an exchange device for exchanging support blocks which support the boards, and an electronic component mounting method of exchanging support blocks supporting the boards.

A conventional system will be described with reference to FIGS. 5A and 5B.

FIGS. 5A and 5B are enlarged sectional views of an essential portion of a support block in a conventional electronic component mounting apparatus. In FIGS. 5A and 5B, a board 14 to which electronic components, etc. are mounted is positioned at a predetermined position over a support block 16 by a transfer belt device 15. The support block 16 is then raised and the board 14 is held on support pins 17 provided in the support block 16. After this, electronic components, etc. are mounted to the board 14.

Setting positions of the support pins in the support block are selected depending on the desired characteristics of rear faces of boards to be produced. In switching the kind of boards in the conventional mounting apparatus, therefore, the support blocks should be changed in accordance with the desired characteristics of the rear faces of the boards, which requires additional processing time. In the case where the volume of production is relatively low and there are a wide variety of kinds of products, namely, boards to be made, this exchange of support blocks inconveniently deteriorates the productivity.

SUMMARY OF THE INVENTION

Accordingly, an object of the present invention is to provide an electronic component mounting apparatus and method which shorten a time required for switching the kinds of boards to be produced and enhance the working efficiency of the facilities, thereby improving the productivity.

In accomplishing these and other objects, according to a first aspect of the present invention, there is provided an electronic component mounting apparatus comprising:

a plurality of support blocks one of which supports a board when mounting an electronic component, wherein a support block is automatically selected from among the plurality of support blocks and exchanged in accordance with the switching of the kind of boards to be supported by the support block.

According to a second aspect of the present invention, there is provided an electronic component mounting apparatus according to the first aspect of the present invention, further comprising: a storing device for storing the plurality of support blocks; and a support block moving device for selecting one of the support blocks stored in the storing device in accordance with the switching of the kind of boards and moving the selected support block from the storing device to a position where the board is supported by the selected support block.

According to a third aspect of the present invention, there is provided an electronic component mounting apparatus according to the first aspect of the present invention, further comprising a single support block driving device for upwardly moving the support block to support the board when the electronic component is mounted on the board, downwardly moving the support block to stop supporting the board, and exchanging the support block with another support block.

According to a fourth aspect of the present invention, there is provided an electronic component mounting apparatus according to the second aspect of the present invention, wherein the support block moving device moves the support block upward to support the board when the electronic component is mounted on the board, and moves the support block downward to stop supporting the board.

According to a fifth aspect of the present invention, there is provided an electronic component mounting method comprising:

selecting one of a plurality of support blocks in correspondence with a kind of board to be supported, based on data indicating relationships between kinds of boards and the support blocks corresponding to the kinds of boards; and exchanging a present support block with the selected support block.

According to a sixth aspect of the present invention, there is provided an electronic component mounting method according to the fifth aspect of the present invention, further comprising, before selecting the support block, inputting the data indicating the relationship between the kinds of boards and the support blocks corresponding to the kinds of boards.

According to seventh and eighth aspects of the present invention, there is provided an electronic component mounting method according to the fifth and sixth aspects of the present invention, further comprising displaying an error when the selected support block is not stored in a support block storing device.

According to a ninth aspect of the present invention, there is provided an electronic component mounting apparatus according to the first aspect of the present invention, wherein the support blocks are different with respect to the positions of pins provided for supporting the boards.

According to a tenth aspect of the present invention, there is provided an electronic component mounting apparatus according to the second aspect of the present invention, wherein the support blocks are different with respect to the positions of pins provided for supporting the boards.

According to an eleventh aspect of the present invention, there is provided an electronic component mounting method according to the fifth aspect of the present invention, wherein the support blocks are different with respect to the positions of pins provided for supporting the boards.

According to a twelfth aspect of the present invention, there is provided an electronic component mounting method according to the sixth aspect of the present invention, wherein the support blocks are different with respect to the positions of pins provided for supporting the boards.

BRIEF DESCRIPTION OF THE DRAWINGS

These and other aspects and features of the present invention will become clear from the following description taken in conjunction with the preferred embodiments thereof with reference to the accompanying drawings, in which:

FIG. 3 is a flow chart showing a method;

DETAILED DESCRIPTION OF THE PREFERRED EMBODIMENTS

Figure 1:
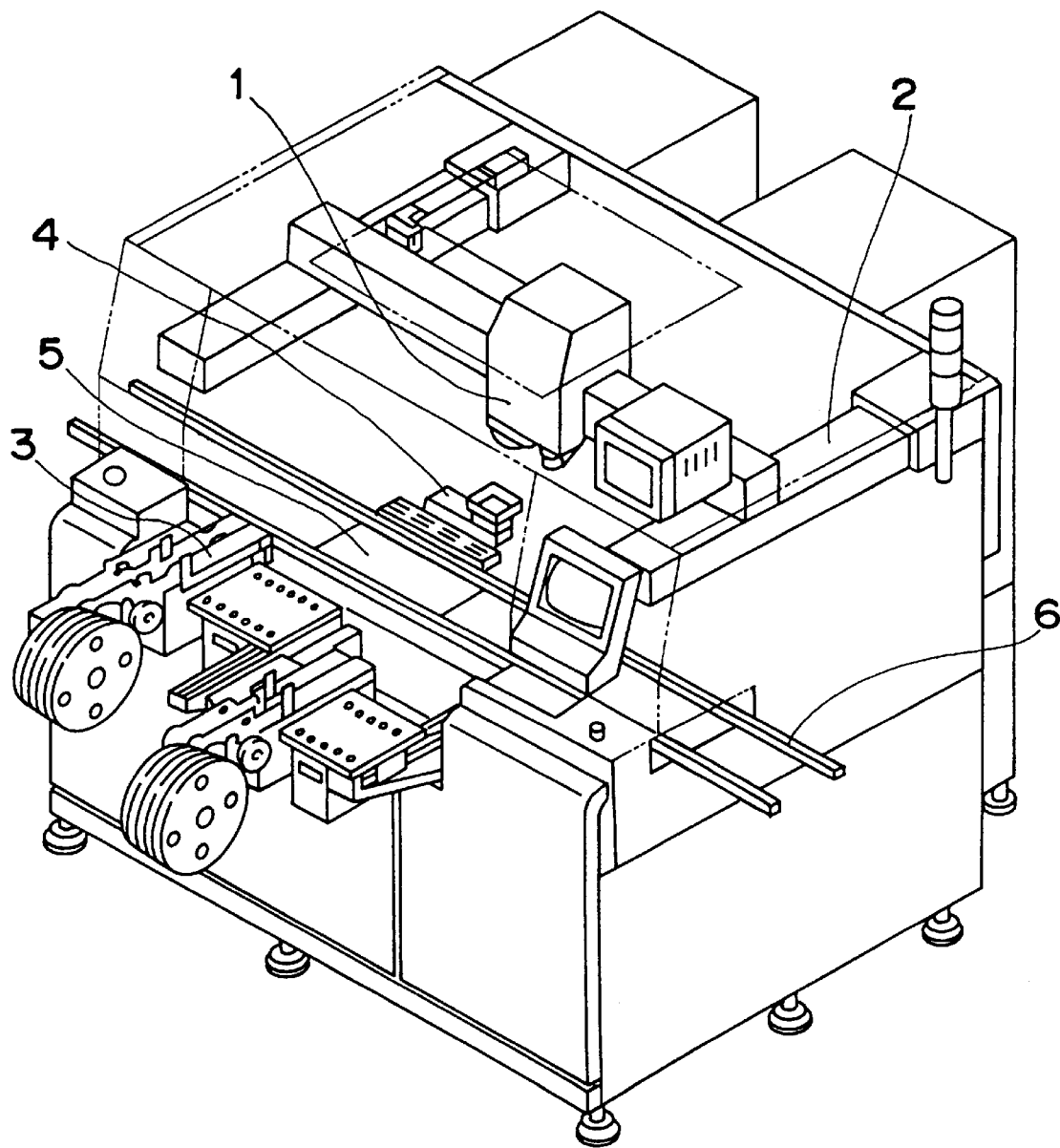
FIG. 1 is a schematic diagram of an electronic component mounting apparatus for carrying out an electronic component mounting method, according to one embodiment of the present invention.

Before the description of the present invention proceeds, it is to be noted that like parts are designated by like reference numerals throughout the accompanying drawings.

Figure 2:
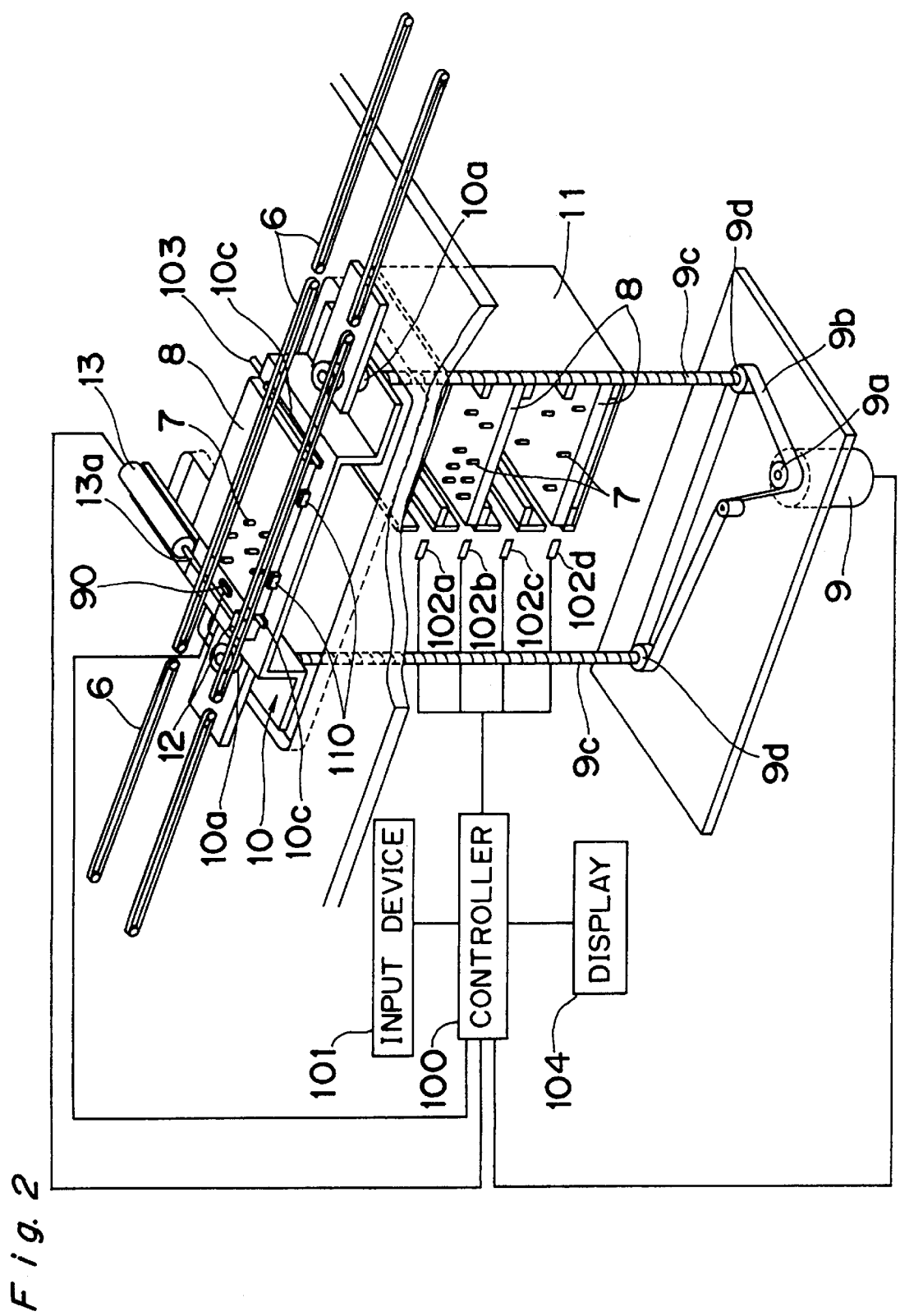
FIG. 2 is an enlarged sectional view of a portion of the apparatus for explaining the embodiment of the present invention.

Hereinbelow, one embodiment of the present invention will be described with reference to FIGS. 1 and 2. FIG. 1 schematically shows an electronic component mounting apparatus according to one embodiment of the present invention. FIG. 2 is an enlarged sectional view of a portion explanatory of a support block exchange device of the apparatus in the present invention. First, a mounting process for electronic components will be discussed with reference to FIG. 1. In FIG. 1, a head part 1 having a suction nozzle for holding an electronic component is positioned by an XY robot 2 movable in X and Y directions perpendicularly to each other. The head part 1 draws a predetermined electronic component from a component feed part 3 and holds the component by suction, and the component is then positioned over a component recognition camera 4. A posture of the component held by suction is detected on the basis of an image obtained by the recognition camera 4. A shifting amount of the head part 1 when holding the electronic component is corrected based on the data obtained with respect to the posture. The head part 1 is consequently positioned at a predetermined position on a board 5, so that the electronic component is accurately mounted to the predetermined position on the board 5.

Now, take-in and take-out processes for the board 5 according to the embodiment will be explained with reference to FIG. 2.

FIG. 2 shows: a transfer belt device 6 for transferring the board 5; support pins 7 disposed on each of a plurality of plate-shaped support blocks 8; a motor 9 for driving up and down a support block holding table 10 holding the support block 8; a rack 11, serving as a support block storing device, provided at one side of the holding table 10 for storing a plurality of support blocks 8 with support pins 7 arranged in different manners; a clamp part 12 for exchanging the support blocks 8; and a cylinder 13 for driving the clamp part 12.

The motor 9 rotates a driving pulley 9a which is connected to a pair of pulleys 9d by a belt 9b so as to rotate the pulleys 9d together with the rotation of the driving pulley 9a. A pair of driving shafts 9c has the pulleys 9d fixed to the lower ends thereof and nuts 10a fixed to the holding table 10 and engaged with the driving shafts 9c so that the driving shafts 9c rotate with respect to the engaged nuts 10a to move the holding table 10 upward and downward. Thus, when the motor 9 rotates the driving pulley 9a in both directions, the pulleys 9d are rotated by the belt 9b so as to rotate the driving shafts 9c in both directions to move the holding table 10 upward and downward. The holding table 10 has a pair of guide rails 10c for guiding the support block 8 on the holding table 10 in a direction perpendicular to the transport direction of the board 5 as transported by the transfer belt device 6. Thus, a support block moving device is constituted by the motor 9, the driving pulley 9a, the belt 9b, the driving shafts 9c, the pulleys 9d, the holding table 10, the clamp portion 12, and the cylinder 13.

Figure 4A:
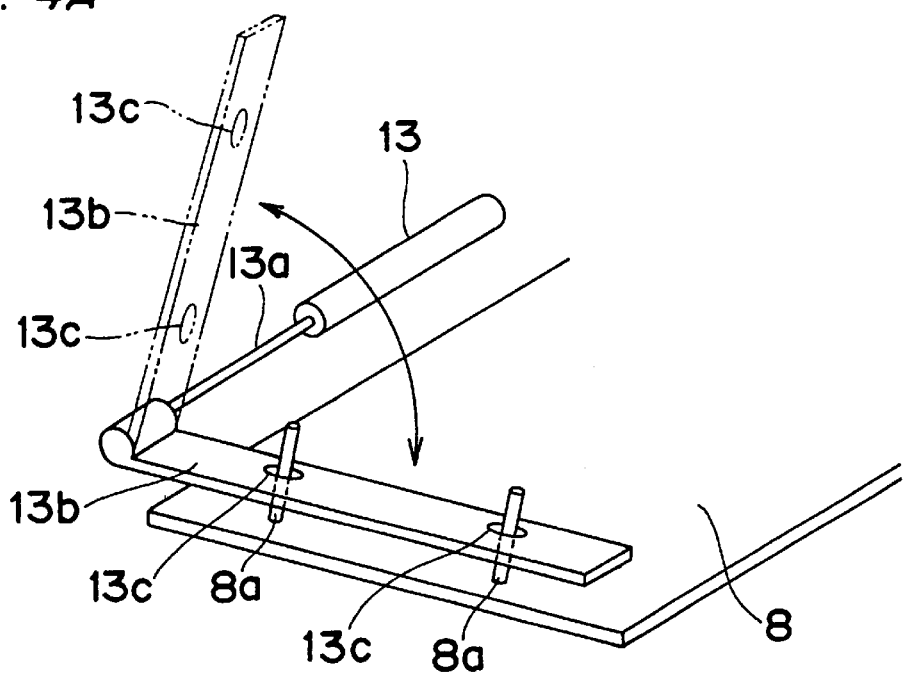
FIGS. 4A and 4B are views showing different clamp mechanisms between a cylinder and a board of the apparatus.

The cylinder 13 has a piston rod 13a with the clamp part 12 at its end. The clamp part 12 clamps the support block 8 on the holding table 10 so as to position the support block 8 thereon without any movement. One example of the clamp part 12 is shown FIG. 4A. This clamp part includes a rotatable plate 13b fixed to the end of the piston rod 13a and a pair of positioning pins 8a fixed on the support block 8. When the holding table 10 with no support block 8 thereon is caused to face the support block 8 in one slot of the rack 11 and the piston rod 13a of the cylinder 13 is rotated clockwise from a removal position shown by dotted lines to an engaging position shown by solid lines, the positioning pins 8a of the support block 8 are inserted into and engaged with holes 13c of the rotatable plate 13b, and the piston rod 13a is forward moved so as to move forward the support block 8 from the slot of the rack 11 to a predetermined position of the holding table 10 while guided by the rails 10c. Conversely, when the holding table 10 with the support table 8 thereon is caused to face a vacant slot of the rack 11, the piston rod 13a is moved backward and then the support block 8 is moved from the predetermined position of the holding table 10 while guided by the rails 10c to the vacant slot of the rack. Then, the support block 8 is stored in the slot, the piston rod 13a of the cylinder 13 is rotated counterclockwise from the engaging position to the removal position and then, the positioning pins 8a of the support block 8 are removed and disengaged from the holes 13c of the rotatable plate 13b.

Figure 4B:
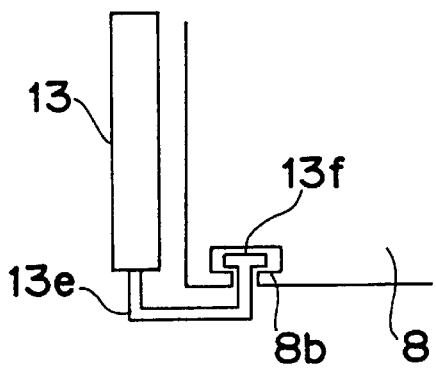
Figure 5A:
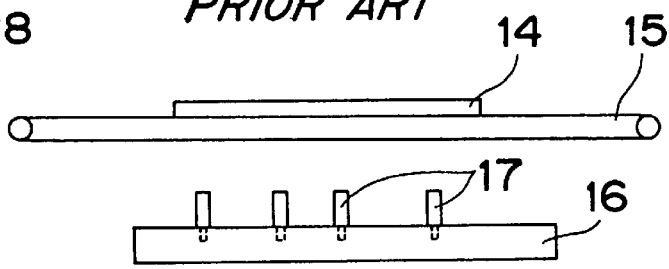
FIGS. 5A and 5B are enlarged sectional views of an essential portion of a support block of an electronic component mounting apparatus in the prior art.
Figure 5B:
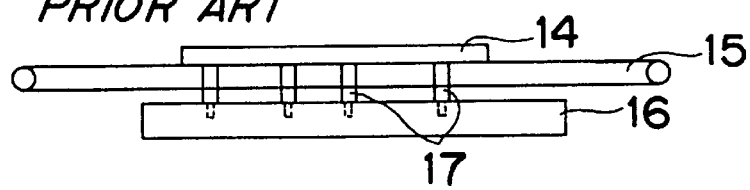

Another example of the clamp part 12 is shown in FIG. 4B. In FIG. 4B, the cylinder 13 has a U-shaped piston rod 13e and a T-shaped clamp portion 13f at its end. The support block 8 has a T-shaped recess 8b into which the T-shaped clamp portion 13f can be engaged. Thus, when the support block 8 is moved from the slot of the rack 11 to the holding table 10, the U-shaped piston rod 13e is rotated to engage the T-shaped clamp portion 13f into the T-shaped recess 8b of the support block 8.

The apparatus further comprises a controller 100 for controlling the exchange of the support blocks 8, an input device 101 such as a key board for inputting instructions into the controller 100 therethrough, a display 104 for displaying an error when the selected support block 8 is not stored in the rack 11, and sensors 102a, 102b, 102c, and 102d, located at slots of the rack 11, for detecting presence of the support block 8 at each slot in the rack 11 to input such information into the controller 100. The controller 100 is connected to the input device 101, the display 104, the sensors 102a–102d, the motor 9, the cylinder 13, and a board detection sensor 90 so that the controller 100 controls operations of the cylinder 13 and the motor 9 based on the input information from the input device 101, the sensors 102a–102d, and the board detection sensor 90. Reference numeral 110 denotes a pair of stoppers for positioning the support block 8 at the predetermined position on the holding table 10 by contacting the side surface of the support block 8 with the stoppers 110.

Instead of the provision of the sensors 102a–102d, there can be provided a sensor 103 located at the side surface of the support block holding table 10 which faces the slots of the rack 11 so as to detect presence of the support block 8 at each slot of the rack 11. In this case, when the support block holding table 10 moves downward and upward, the sensor 103 detects the presence of the support block 8 at each slot of the rack 11 to input such information into the controller 100.

First, a board 5 where the electronic component is to be mounted is transferred by the transfer belt device 6 to a position above the support block 8 having the plurality of support pins 7. At this time, when it is detected by the board detection sensor 90 or the like that the board 5 has reached a predetermined position above the support block 8, the holding table 10 is raised to a predetermined position by the motor 9 based on the control operation of the controller 100 to hold the board 5 on the support pins 7 of the support block 8. Then, the electronic components are mounted on the board 5 held by the support block 8, and, upon completion of the mounting, based on the control operation of the controller 100, the holding table 10 is lowered to a predetermined position by the motor 9. The board 5 having the mounted electronic components is taken out by the transfer belt device 6.

An operation for exchanging support blocks 8 corresponding to the switching of the kind of boards 5 based on the control operation of the controller 100, will be discussed below. When the kind of boards 5 is changed, the support block 8 should match the switched board 5. That is, the support pins 7 on the support block 8 should be arranged to conform to the switched board 5. The storing rack 11 stores the support blocks 8 corresponding to a plurality of kinds of boards 5. In order to exchange the support blocks 8 (i.e. in order to exchange a selected support block for a support block which had been in use), the holding table 10 is positioned by the motor 9 relative to a vacant slot in the storing rack 11, and the support block 8 currently used is clamped by the clamp part 12 arranged over the holding table 10 and moved to the vacant slot of the rack 11 by the cylinder 13 as described above. After the support block 8 is accommodated in the vacant slot, the clamp part 12 is released and the holding table 10 is positioned by the motor 9 to a position in the rack 11 of the support block 8 to be used next. The support block 8 to be used next is clamped by the clamp part 12 and set at the predetermined position on the holding table 10 by the cylinder 13. The holding table 10, after exchanging the support blocks 8, is raised again by the motor 9 when the exchange operation is finished.

The support blocks 8 can be automatically exchanged if the support blocks 8 corresponding to the kinds of boards 5 are preliminarily designated and input in mounting programs stored in the controller 100 of the apparatus. The mounting program corresponding to the kind of boards 5 is selected, to thereby automatically select and exchange the corresponding support block 8. The exchange operation may also be carried out simply through the input device 101 such as a key input, without inputting of a mounting program.

That is, in such a case, the electronic component mounting method according to the embodiment is executed in accordance with the flow chart shown in FIG. 3. First, at step S, data indicating the relationship between the kinds of boards 5 and the support blocks 8 corresponding to the kinds of boards 5 is input into the controller 100 through the input device 100. At step S2, by the controller 100, one of support blocks 8 in correspondence with a kind of board 5 to be supported is selected based on the input data indicating the relationship. At step S3, it is decided by the controller 100 whether or not the selected support block 8 is stored in the rack 11. If the selected support block 8 is not stored in the rack 11, an error is displayed on the display 104 at step S5. When the selected support block 8 is stored in the rack 11, the moving amount of the holding table 10 is determined in accordance with the number of the slot where the selected support block 8 is stored in the rack 11 and the number of a vacant slot where the support block 8 placed on the holding table 10 will be stored. At step S4, the holding table 10 is driven by the motor 9 based on the determined moving amount and the present support block 8 on the holding table 10 is caused to face the vacant slot of the rack 11 to move the support block 11 into the vacant slot. Then, the holding table 10 is moved to face the selected support block 8 stored in the slot of the rack 11 and the selected support block 8 is taken out from the slot.

As is described hereinabove, in the electronic component mounting apparatus according to the embodiment of the present invention, the plurality of support blocks for supporting the boards when mounting the electronic components, etc. thereon are provided. The support block corresponding to the kind of boards is automatically selected among the plurality of support blocks when the kind of boards is changed. Accordingly, the switching time for switching the kind of boards is reduced and the working efficiency of the facilities is enhanced, thus improving the productivity for mounting the electronic components. The plurality of support blocks provided in the electronic component mounting apparatus are stored in the storing device set at one side of the support block moving device. When the support blocks are to be exchanged, the current support block is stored in a vacant slot of the storing device, and the support block to be used next is fed from the storing device. The up-and-down movement of the support block when the electronic components are mounted on the board is carried out by the same driving device as when the support block is moved up and down to be exchanged. The driving arrangement can thus be simplified.

The electronic component mounting apparatus can include a process for inputting data of the support blocks corresponding to the kinds of boards to be produced, a process for selecting the corresponding support block based on the input data, and a process for exchanging the present support block with the selected support block, whereby the required support block can be automatically exchanged on the basis of the selection of a mounting program corresponding to the kind of boards.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. An electronic component mounting apparatus, comprising:
    a table to support a block;
    a storing device to store a plurality of blocks;
    a moving device to re-position said table at different locations relative to said storing device; and
    an exchanging device to remove a first block from said table and deposit the first block into said storing device, and to remove a second block from said storing device and deposit the second block onto said table, after said moving device has re-positioned said table relative to said storing device.

2. The electronic component mounting apparatus according to claim 1, wherein said storing device comprises a rack having a plurality of vertically arranged slots which are to receive the plurality of blocks, respectively, and further comprising a sensor associated with each of said plurality of vertically arranged slots to detect the presence of a block within its respective slot.

3. The electronic component mounting apparatus according to claim 2, wherein said table includes a pair of guide rails to guide a block as the exchanging device is removing the block from said table or as the exchanging device is depositing the block onto said table.

4. The electronic component mounting apparatus according to claim 3, wherein said lifting device includes a motor and a pair of drive shafts operably associated with said motor and said table, such that when said motor is operated in a first mode said drive shafts raise said table relative to said rack, and when said motor is operated in a second mode said drive shafts lower said table relative to said rack.

5. The electronic component mounting apparatus according to claim 4, wherein said exchanging device includes a cylinder, a rotatable and translatable piston rod extending from said cylinder, and an arm attached to said piston rod, such that upon rotation of said piston rod said arm rotates and engages a portion of a block that is on said table or in one of said vertically arranged slots, and then upon translation of said piston rod said arm translates while engaged with the block, whereby the block is removed from said table or deposited onto said table.

6. The electronic component mounting apparatus according to claim 5, and further including a mounting head to mount an electronic component onto a board supported by a block on said table.

7. The electronic component mounting apparatus according to claim 6, and further including a controller to automatically control said moving device and said exchanging device in response to a board onto which an electronic component is to be mounted.

* * * * *